(12) United States Patent
Moon

(10) Patent No.: US 9,190,461 B2
(45) Date of Patent: Nov. 17, 2015

(54) ORGANIC LIGHT-EMITTING DISPLAY DEVICE

(71) Applicant: Samsung Display Co., Ltd., Yongin, Gyeonggi-Do (KR)

(72) Inventor: Joong Soo Moon, Cheonan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/108,543

(22) Filed: Dec. 17, 2013

(65) Prior Publication Data

US 2014/0183484 A1   Jul. 3, 2014

(30) Foreign Application Priority Data

Dec. 28, 2012   (KR) .................. 10-2012-0156942

(51) Int. Cl.
*H01L 27/32* (2006.01)

(52) U.S. Cl.
CPC ......... *H01L 27/3276* (2013.01); *H01L 27/3216* (2013.01)

(58) Field of Classification Search
CPC ............ H01L 2251/50; H01L 2251/5315; H01L 2251/558; H01L 27/3244; H01L 27/12; H01L 27/3211; H01L 27/322; H01L 27/326; H01L 27/3262; H01L 27/3276; H01L 27/1214; H01L 27/124; H01L 27/3248; H01L 27/1222; H01L 27/1248; H01L 27/1288; H01L 27/3279; H01L 51/56; H01L 51/52; H01L 51/5281; H01L 27/3216

See application file for complete search history.

(56) References Cited

U.S. PATENT DOCUMENTS

| 7,863,612 | B2 * | 1/2011 | Sato ............................... 257/59 |
| 2004/0108818 | A1 * | 6/2004 | Cok et al. .................... 315/169.3 |
| 2006/0170712 | A1 * | 8/2006 | Miller et al. .................. 345/695 |
| 2006/0181202 | A1 * | 8/2006 | Liao et al. ..................... 313/504 |
| 2011/0122355 | A1 * | 5/2011 | Matsumuro et al. .......... 349/143 |
| 2011/0210927 | A1 * | 9/2011 | Mizuhashi et al. ............ 345/173 |
| 2012/0327331 | A1 * | 12/2012 | Yim et al. ....................... 349/62 |

FOREIGN PATENT DOCUMENTS

| KR | 1020070020687 A | 2/2007 |
| KR | 1020100021311 A | 2/2010 |
| KR | 1020120044657 A | 5/2012 |

* cited by examiner

*Primary Examiner* — Yu-Hsi D Sun
*Assistant Examiner* — Wasiul Haider
(74) *Attorney, Agent, or Firm* — Robert E. Bushnell, Esq.

(57) ABSTRACT

There is provided an organic light-emitting display device comprising a plurality of pixels arranged in a matrix pattern and a plurality of wiring lines formed in a zigzag pattern and extending in a row direction between the pixels.

18 Claims, 9 Drawing Sheets

ORGANIC LIGHT-EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on Dec. 28, 2012 and duly assigned Serial No. 10-2012-0156942.

BACKGROUND OF THE INVENTION

1. Field of the Invention

Embodiments of the present invention generally relate to an organic light-emitting display device, and more particularly, to an organic light-emitting display device with an extended life.

2. Description of the Related Art

An organic light-emitting display device may include a plurality of pixels, and each of the pixels may include a first electrode, a second electrode, and an organic layer interposed between the first electrode and the second electrode. The organic layer may emit light at a luminance level corresponding to an electric current flowing between the first electrode and the second electrode. The organic light-emitting display device may display a desired image by controlling the electric current flowing between the first electrode and the second electrode.

The organic layer may deteriorate over time, resulting in a reduction in the emission efficiency of the organic layer. Examples of deterioration of the organic layer may include corrosion of the organic layer due to introduction of oxygen or moisture from outside the organic light-emitting display device and crystallization of a material contained in the organic layer due to a change in the structure or temperature of the organic layer caused by electrical stress acting on the organic layer while the organic light-emitting display device is being driven. The deterioration of the organic layer may determine the lifespan of the organic light-emitting display device.

Each organic layer may deteriorate to a different degree according to the color of light that the organic layer emits. For example, lifespan may be reduced in the order of an organic layer which emits red light, an organic layer which emits green light, and an organic layer which emits blue light. The performance of an organic layer may deteriorate according to the density of an electric current flowing through the organic layer. For example, as the density of an electric current flowing through an organic layer increases, the deterioration of the organic layer may increase.

SUMMARY OF THE INVENTION

To solve the above described problems and to make organic layers of an organic light-emitting display device have an equal lifespan, the present invention provides various embodiments by forming each organic layer with a different size according to the color of light that a respective organic layer emits.

Aspects of the present invention provide an organic light-emitting display device in which the size of an organic layer of a color which deteriorates rapidly is increased to extend the life of the organic light-emitting display device.

Aspects of the present invention also provide an organic light-emitting display device with an improved aperture ratio.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an organic light-emitting display device comprising a plurality of pixels arranged in a matrix pattern and a plurality of wiring lines formed in a zigzag pattern and extending in a row direction between the pixels.

According to another aspect of the present invention, there is provided an organic light-emitting display device comprising a substrate, an insulating layer disposed on the substrate, a plurality of bottom electrodes arranged on the insulating layer in a matrix pattern, an organic layer disposed on each of the bottom electrodes, a top electrode disposed on the organic layer, and a plurality of wiring lines formed on the insulating layer in a zigzag pattern and placed between rows of the bottom electrodes.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
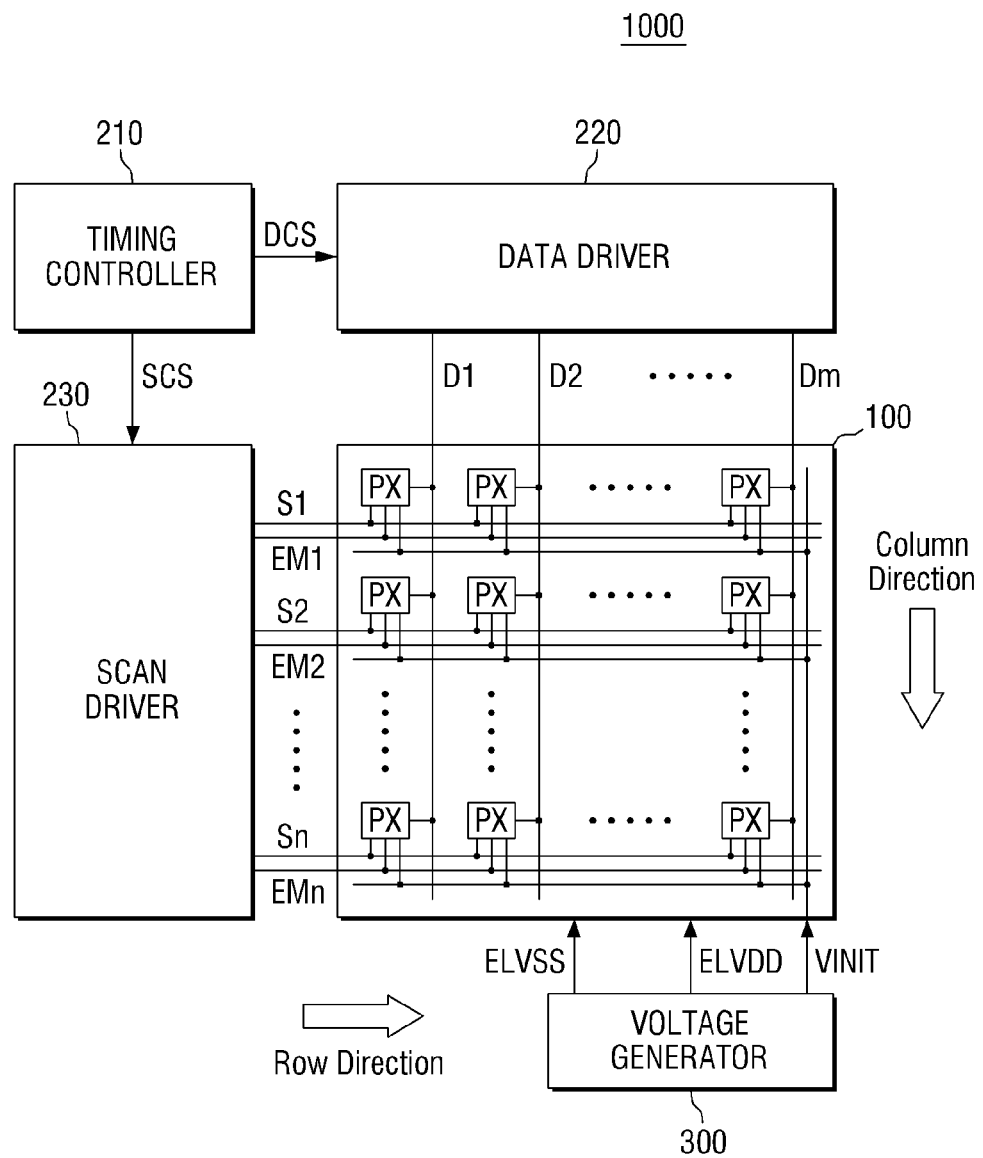
FIG. 1 is a block diagram of an organic light-emitting display device constructed as an embodiment according to the principles of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Embodiments of the present invention will hereinafter be described with reference to the attached drawings.

FIG. 1 is a block diagram of an organic light-emitting display device 1000 constructed as an embodiment according to the principles of the present invention.

Referring to FIG. 1, the organic light-emitting display device 1000 includes a display panel 100.

The display panel 100 may include a plurality of pixels PX and a plurality of wiring lines for transmitting signals to the pixels PX. The pixels PX may be arranged in a matrix pattern. Each of the pixels PX may emit light of one of red, green and blue colors. The light emission of the pixels PX may be controlled by first through $n^{th}$ scan signals S1 through Sn, first through $m^{th}$ data signals D1 through Dm, and first through $n^{th}$ emission signals EM1 through EMn provided from outside of the display panel 100. The first through $n^{th}$ scan signals S1 through Sn may control whether the pixels PX will receive the first through $m^{th}$ data signals D1 through Dm, respectively. Each of the first through $m^{th}$ data signals D1 through Dm may include information about a luminance level of light that a corresponding one of the pixels PX will emit. The first through $n^{th}$ emission signals EM1 through EMn may respectively control the light emission of the pixels PX. The operation of the pixels PX will now be described in detail with reference to FIG. 2.

Figure 2:
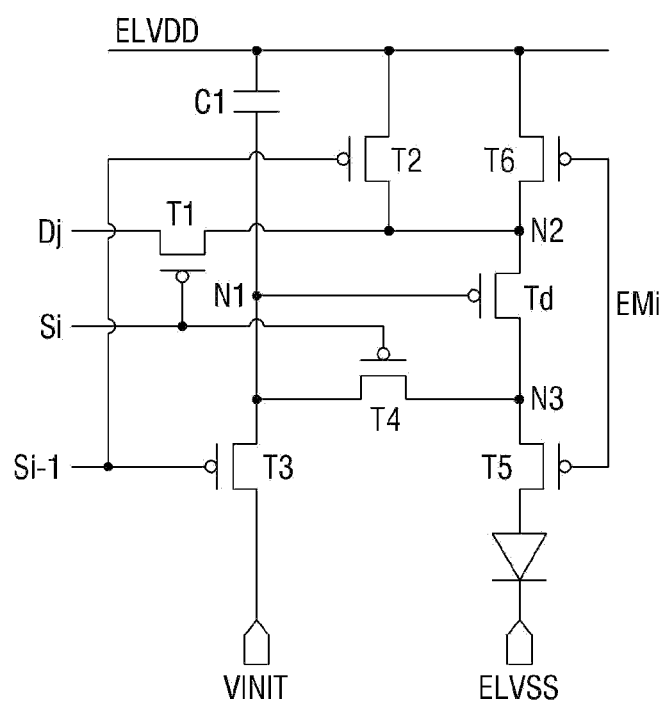
FIG. 2 is a circuit diagram of a pixel of the organic light-emitting display device shown in FIG. 1.

FIG. 2 is a circuit diagram of a pixel PX of the organic light-emitting display device 1000 shown in FIG. 1. Referring to FIG. 2, the pixel PX may include first through sixth transistors T1 through T6, a driving transistor Td, an organic light-emitting diode OLED, and a first capacitor C1.

The driving transistor Td has a drain electrode connected to the fifth transistor T5 and the fourth transistor T4 and a source electrode connected to the sixth transistor T6 and the second transistor T2. The driving transistor Td transmits an electric current, which corresponds to a voltage difference between the source electrode and a gate electrode, to the organic light-emitting diode OLED, so that the organic light-emitting diode OLED emits light corresponding to the electric current.

The fifth and sixth transistors T5 and T6 are respectively connected to the drain electrode and the source electrode of the driving transistor Td so as to pass or block the electric current transmitted from the driving transistor Td to the organic light-emitting diode OLED. An $i^{th}$ emission signal EMi is transmitted to a gate electrode of each of the fifth and sixth transistors T5 and T6, and the operation of the fifth and sixth transistors T5 and T6 is controlled by the $i^{th}$ emission signal EMi.

A $(i-1)^{th}$ scan signal Si-1 may be transmitted to a gate electrode of the second transistor T2. The second transistor T2 may be turned on by the $(i-1)^{th}$ scan signal Si-1 before an $i^{th}$ scan signal Si is transmitted to the pixel PX. When turned on, the second transistor T2 may transmit a power supply voltage ELVDD to the source electrode of the driving transistor Td.

The $i^{th}$ scan signal Si may be transmitted to a gate electrode of the first transistor T1. The first transistor T1 may be turned on by the $i^{th}$ scan signal Si. When turned on, the first transistor T1 may transmit a $j^{th}$ data signal Dj to the source electrode of the driving transistor Td.

The $(i-1)^{th}$ scan signal Si-1 may be transmitted to a gate electrode of the third transistor T3. The third transistor T3 may be turned on by the $(i-1)^{th}$ scan signal Si-1. When turned on, the third transistor T3 may transmit an initialization voltage VINIT to the gate electrode of the driving transistor Td.

The $i^{th}$ scan signal Si may be transmitted to a gate electrode of the fourth transistor T4. The fourth transistor T4 may be turned on by the $i^{th}$ scan signal Si. When turned on, the fourth transistor T4 may connect the gate electrode and the drain electrode of the driving transistor Td. Accordingly, the driving transistor Td may be diode-connected.

The first capacitor C1 is interposed between the gate electrode of the driving transistor Td and the power supply voltage ELVDD and maintains a voltage applied to the gate electrode of the driving transistor Td.

An anode of the organic light-emitting diode OLED may be connected to the fifth transistor T5, and a base power supply voltage ELVSS may be applied to a cathode of the organic light-emitting diode OLED. When the fifth and sixth transistors T5 and T6 are turned on, the organic light-emitting diode OLED may emit light at a luminance level which corresponds to an electric current flowing through the organic light-emitting diode OLED.

Referring back to FIG. 1, the wiring lines may include wiring lines for transmitting the first through $n^{th}$ scan signals S1 through Sn, the first through $m^{th}$ data signals D1 through Dm, the first through $n^{th}$ emission signals EM1 through EMn, and the initialization voltage VINIT. The wiring lines for transmitting the first through $n^{th}$ scan signals S1 through Sn and the first through $n^{th}$ emission signals EM1 through EMn may extend in a row direction of the pixels PX. The wiring lines for transmitting the first through $m^{th}$ data signals D1 through Dm may extend in a column direction of the pixels PX. The wiring lines for transmitting the initialization voltage VINIT may extend in the row direction of the pixels PX. The wiring lines for transmitting the initialization voltage VINIT may be formed in a zigzag pattern. If the wiring lines for transmitting the initialization voltage VINIT are formed in a zigzag pattern, an aperture ratio of the organic light-emitting display device 1000 can be improved, and the area of an organic layer in each blue pixel PX can be increased to extend the life of the blue pixel PX. This will be described in more detail later.

The organic light-emitting display device 1000 may further include a driving unit and a voltage generator 300.

The driving unit may include a timing controller 210, a data driver 220 and a scan driver 230. The timing controller 210 may receive image data from an external source and generate a scan driver control signal SCS for controlling the scan driver 230 and a data driver control signal DCS for controlling the data driver 220 based on the received image data.

The data driver 220 may receive the data driver control signal DCS and generate the first through m$^{th}$ data signals D1 through Dm corresponding to the data driver control signal DCS.

The scan driver 230 may receive the scan driver control signal SCS and generate the first through n$^{th}$ scan signals S1 through Sn and the first through n$^{th}$ emission signals EM1 through EMn corresponding to the scan driver control signal SCS.

The voltage generator 300 may generate the initialization voltage VINIT, the power supply voltage ELVDD and the base power supply voltage ELVSS and provide the generated voltages VINIT, ELVDD and ELVSS to the display panel 100. According to some embodiments, the initialization voltage VINIT, the power supply voltage ELVDD, and the base power supply voltage ELVSS are variable. Thus, the timing controller 210 may control the voltage generator 300 to vary the initialization voltage VINIT, the power supply voltage ELVDD, and the base power supply voltage ELVSS.

Figure 3:
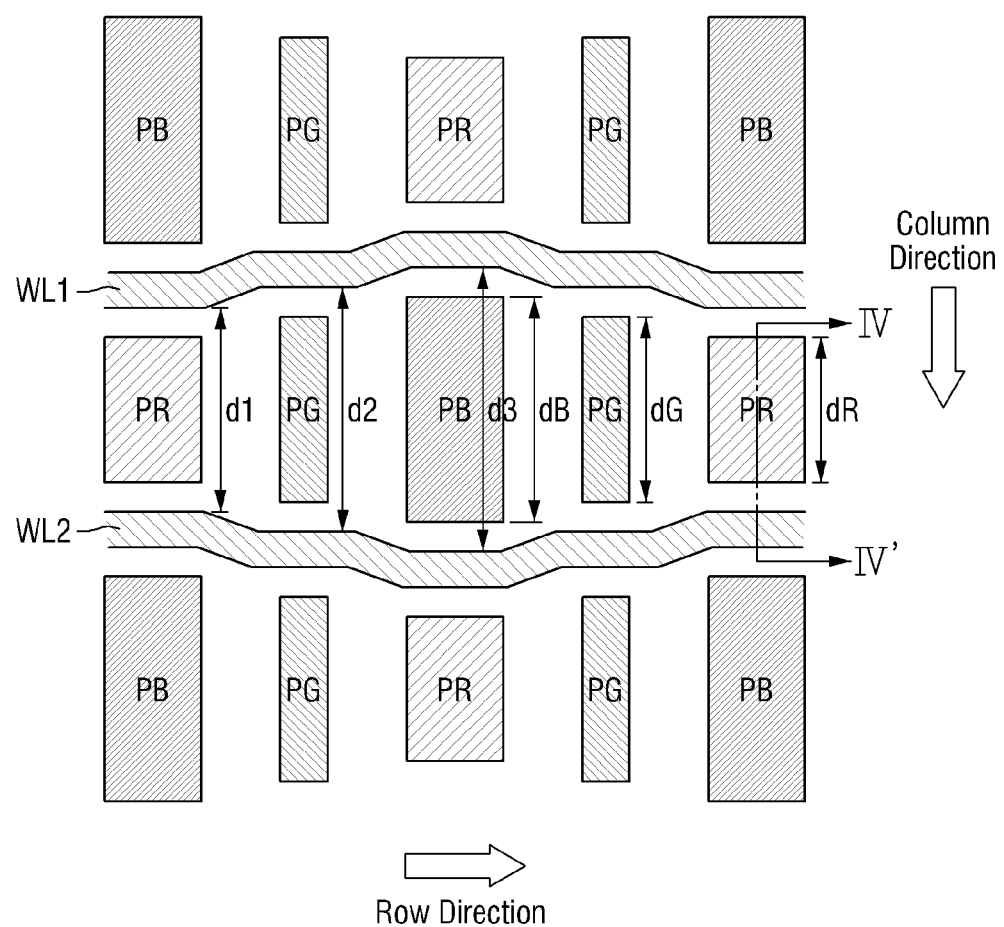
FIG. 3 is a plan view schematically illustrating the arrangement of pixels and wiring lines of the organic light-emitting display device shown in FIG. 1.

The arrangement of the pixels PX and the wiring lines will now be described in more detail with reference to FIG. 3. FIG. 3 is a plan view schematically illustrating the arrangement of the pixels PX and wiring lines WL1 and WL2 of the organic light-emitting display device 1000 shown in FIG. 1.

Referring to FIG. 3, the pixels PX may be divided into first pixels PR, second pixels PG, and third pixels PB. For example, the first pixels PR may be pixels that emit red light, the second pixels PG may be pixels that emit green light, and the third pixels PB may be pixels that emit blue light. The second pixels PG may be placed on both sides of each of the first pixels PR in the row direction. The third pixels PB may be placed on both sides of each of the first pixels PR in the column direction. One first pixel PR and one third pixel PB may be placed on both sides of each of the second pixels PG in the row direction. The second pixels PG may be placed on both sides of each of the second pixels PG in the column direction. The second pixels PG may be placed on both sides of each of the third pixels PB in the row direction. The first pixels PR may be placed on both sides of each of the third pixels PB in the column direction.

The wiring lines WL1 and WL2 may be placed between rows of the pixels PR, PG and PB. The initialization voltage VINIT may be applied to the wiring lines WL1 and WL2. According to some embodiments, signals other than the initialization voltage VINIT may be transmitted to the wiring lines WL1 and WL2. Wiring lines formed to not overlap the pixels PR, PG and PB may correspond to the wiring lines WL1 and WL2 of FIG. 3, regardless of what signals are transmitted to the wiring lines.

The wiring lines WL1 and WL2 may be formed in a zigzag pattern. If the wiring lines WL1 and WL2 are formed in a zigzag pattern, the pixels PR, PG and PB can be formed to have different lengths in the column direction. For example, the pixels PR, PG and PB can be formed such that a length dR of the first pixels PR in the column direction is smaller than a length dG of the second pixels PG in the column direction and that the length dG of the second pixels PG in the column direction is smaller than a length dB of the third pixels PB in the column direction. Accordingly, the third pixels PB whose organic layers deteriorate relatively rapidly can easily be formed larger in area than the first and second pixels PR and PG. Generally, the luminance of light emitted from a pixel PX corresponds to an electric current flowing through an organic layer of the pixel PX. Therefore, if the third pixels PB are formed larger in area than the first and second pixels PR and PG, the density of an electric current flowing through the organic layer of each of the third pixels PB may be reduced so that the third pixels PB can emit light at the same luminance level as the first and second pixels PR and PG. An organic layer included in a pixel PX deteriorates more as the density of an electric current flowing through the organic layer increases. Therefore, a reduction in the density of the electric current flowing through the organic layer included in each of the third pixels PB may lead to an increase in the life of each of the third pixels PB. That is, if the wiring lines WL1 and WL2 are formed in a zigzag pattern, it is possible to extend the life of the third pixels PB which have a shortest life, thereby extending the life of the organic light-emitting display device 1000. In addition, since a ratio of the area of a non-emission region other than the pixels PX to the area of the pixels PX is reduced, the aperture ratio of the organic light-emitting display device 1000 can be improved.

The wiring lines WL1 and WL2 may include a first wiring line WL1 and a second wiring line WL2. The first wiring line WL1 and the second wiring line WL2 may be adjacent to each other. The first wring line WL1 may be placed adjacent to a side of a row of pixels PX, and the second wiring line WL2 may be placed adjacent to the other side of the row of pixels PX. If the first and second wiring lines WL1 and WL2 are formed in a zigzag pattern, a distance between the first wiring line WL1 and the second wiring line WL2 may vary according to location. For example, a distance d1 between the first wiring line WL1 and the second wiring line WL2 measured across the first pixels PR may be smaller than a distance d2 measured across the second pixels PG, and the distance d2 measured across the second pixels PG may be smaller than a distance d3 measured across the third pixels PB. In this case, since the third pixels PB can be formed wider than the first and second pixels PR and PG, the life of the third pixels PB which have a shortest life can be extended, thereby extending the life of the organic light-emitting display device 1000. In addition, the aperture ratio of the organic light-emitting display device 1000 can be improved.

Figure 4:
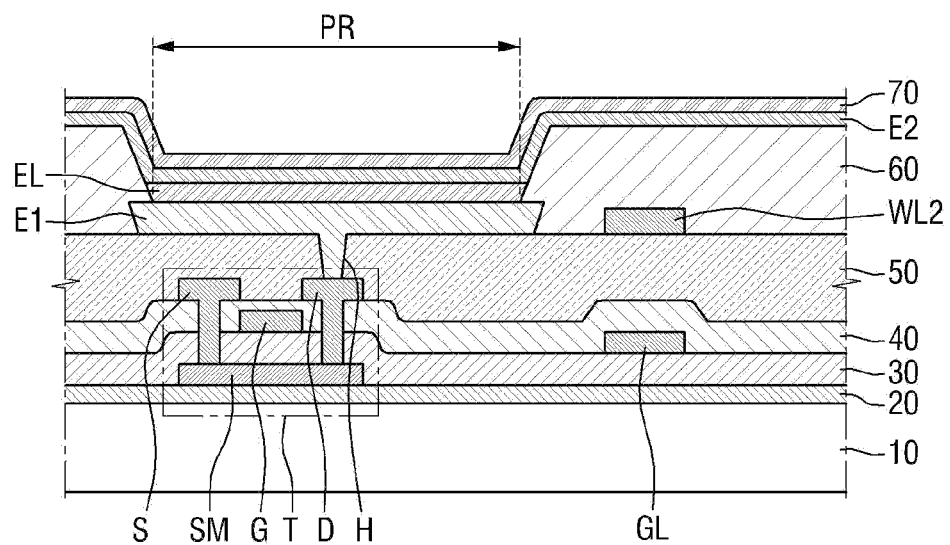
FIG. 4 is a cross-sectional view of the organic light-emitting display device, taken along the line IV-IV' of FIG. 3.

The arrangement of the pixels PX and the wiring lines WL1 and WL2 will now be described in more detail with reference to FIG. 4. FIG. 4 is a cross-sectional view of the organic light-emitting display device 1000, taken along the line IV-IV' of FIG. 3.

Referring to FIG. 4, the organic light-emitting display device 1000 may include a substrate 10, a buffer layer 20, a semiconductor layer SM, a gate insulating layer 30, a gate electrode G, an interlayer insulating film 40, a source electrode S, a drain electrode D, a planarization layer 50, a bottom electrode E1, an organic layer EL, a top electrode E2, a capping layer 70, the second wiring line WL, and a gate line GL.

The substrate 10 may support other components of the organic light-emitting display device 1000. The substrate 10 may be formed of an insulating material. For example, the substrate 10 may be formed of, but not limited to, glass, polyethylene terephthalate (PET), polycarbonate (PC), polyethersulfone (PES), polyimide (PI), or polymethyl methacrylate (PMMA). According to some embodiments, the substrate 10 may also be formed of a flexible material.

The buffer layer 20 may be formed on a top surface of the substrate 10. The buffer layer 20 may prevent penetration of impurity elements and planarize the top surface of the substrate 10. The buffer layer 20 may be formed of various materials that can perform the above functions. For example, the buffer layer 20 may be formed of any one of a silicon nitride ($SiN_x$) layer, a silicon oxide ($SiO_2$) layer, and a silicon oxynitride ($SiO_xN_y$) layer. According to some embodiments, the buffer layer 20 may also be omitted.

The semiconductor layer SM may be disposed on the buffer layer 20. The semiconductor layer SM may be formed of an amorphous silicon layer or a polycrystalline silicon layer. The semiconductor layer SM may include a channel region undoped with impurities and a source region and a drain region which are disposed on both sides of the channel region and are p+-doped to contact the source electrode S and the drain electrode D, respectively. Impurities used to dope the semiconductor layer SM may be P-type impurities including boron (B), such as $B_2H_6$. The type of impurities used to dope the semiconductor layer SM may vary depending on the embodiment. According to some embodiments, the semiconductor layer SM may also be formed of an oxide semiconductor.

The gate insulating layer 30 may be disposed on the semiconductor layer SM. The gate insulating layer 30 may insulate the gate electrode G, which will be formed later, and the semiconductor layer SM from each other. The gate insulating layer 30 may be formed of silicon nitride ($SiN_x$) or silicon oxide ($SiO_2$).

The gate electrode G may be disposed on the gate insulating layer 30. The gate electrode G may overlap at least a region of the semiconductor layer SM. A voltage applied to the gate electrode G may control the semiconductor layer SM to have conductivity or non-conductivity. For example, if a relatively high voltage is applied to the gate electrode G, the semiconductor layer SM may have conductivity, thereby electrically connecting the drain electrode D and the source electrode S to each other. If a relatively low voltage is applied to the gate electrode, the semiconductor layer SM may have non-conductivity, thereby insulating the drain electrode D and the source electrode S from each other.

The gate line GL may be disposed on the gate insulating layer 30. The gate line GL and the gate electrode G may be formed on the same layer by the same process. The gate line GL may transmit the first through $n^{th}$ scan signals S1 through Sn to the gate electrode G.

The source electrode S and the drain electrode D may be disposed on the interlayer insulating film 40. The source electrode S and the drain electrode D may respectively be connected to the semiconductor layer SM by through holes which penetrate through the interlayer insulating film 40 and the gate insulating layer 30. The source electrode S, the drain electrode D, the gate electrode G, and the semiconductor layer SM may form a thin-film transistor T, and the thin-film transistor T may determine whether to provide a signal transmitted to the source electrode S to the drain electrode D based on the voltage applied to the gate electrode G.

The planarization layer 50 may be disposed on the source electrode S, the drain electrode D, and the interlayer insulating film 40. To improve the emission efficiency of the organic layer EL disposed on the planarization layer 50, the planarization layer 50 may be formed to have a flat top surface without a step difference. The planarization layer 50 may be formed of an insulating material. For example, the planarization layer 50 may be formed of one or more materials selected from, but not limited to, polyacrylates resin, epoxy resin, phenolic resin, polyamides resin, polyimides rein, unsaturated polyesters resin, poly phenylenethers resin, poly phenylenesulfides resin, and benzocyclobutene (BCB).

A contact hole H may be formed in the planarization layer 50. The contact hole H may be formed to expose a top surface of the drain electrode D of the thin-film transistor T. The bottom electrode E1 and the drain electrode D may be connected to each other by the contact hole H.

The bottom electrode E1 may be disposed on the planarization layer 50. The bottom electrode E1 may be connected to the drain electrode D by the contact hole H. A signal transmitted from the drain electrode D to the bottom electrode E1 may control light emission of the organic layer EL.

The bottom electrode E1 may be formed of a reflective conductive material. For example, the bottom electrode E1 may be formed to have a structure of, but not limited to, Ag/indium tin oxide (ITO), ITO/Ag/ITO, Mo/ITO, Al/ITO, or Ti/ITO. The bottom electrode E1 formed of a reflective conductive material may reflect light generated by the organic layer EL in an upward direction.

Figure 5:
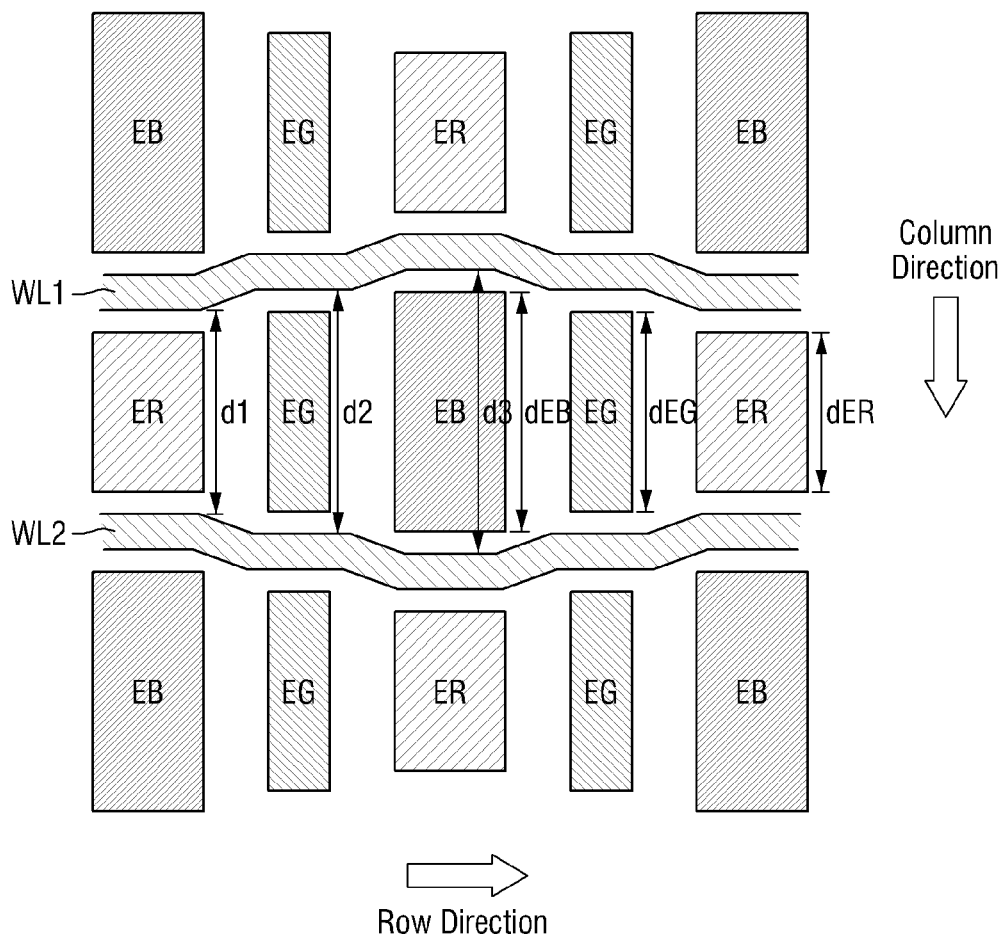
FIG. 5 is a plan view schematically illustrating the arrangement of bottom electrodes and the wiring lines of the organic light-emitting display device shown in FIG. 1.

The second wiring line WL2 may be disposed on the planarization layer 50 to be separated from the bottom electrode E1. The second wiring line WL2 and the bottom electrode EL may be formed on the same layer by the same process. If the second wiring line WL2 is formed on the same layer as the bottom electrode E1, the placement of the bottom electrode E1 as well as the placement of each pixel PX is limited by the placement of the second wiring line WL2. Therefore, if the second wiring line WL2 is formed in a zigzag pattern, the third pixels PB can be formed larger in area than the first and second pixels PR and PG, thereby increasing the life and aperture ratio of the organic light-emitting display device 1000. Although not shown in FIG. 4, a description of the first wiring line WL1 is substantially identical to that of the second wiring line WL2. The arrangement of the wiring lines WL1 and WL2 and the bottom electrodes E1 will now be described in more detail with reference to FIG. 5. FIG. 5 is a plan view schematically illustrating the arrangement of the bottom electrodes E1 and the wiring lines WL1 and WL2 of the organic light-emitting display device 1000 shown in FIG. 1.

Referring to FIG. 5, the bottom electrodes E1 may be divided into first through third bottom electrodes ER, EG and EB. The first bottom electrode ER may be placed in each of the first pixels PR, the second bottom electrode EG may be placed in each of the second pixels PG, and the third bottom electrode EB may be placed in each of the third pixels PB. The arrangement of the first through third bottom electrodes ER, EG and EB may be substantially identical to the arrangement of the first through third pixels PR, PG and PB in FIG. 3. A length dER of the first bottom electrode ER in the column direction may be smaller than a length dEG of the second bottom electrode EG in the column direction, and the length dEG of the second bottom electrode EG in the column direction may be smaller than a length dEB of the third bottom electrode EB in the column direction. In this case, the third pixels PB may be formed longer in the column direction than the first and second pixels PR and PG. Accordingly, since the third pixels PB can easily be formed larger than the first and second pixels PR and PG, the life of the third pixels PB can be extended, thereby extending the life of the organic light-emitting display device 1000. In addition, the aperture ratio of the organic light-emitting display device 1000 can be improved.

Figure 6:
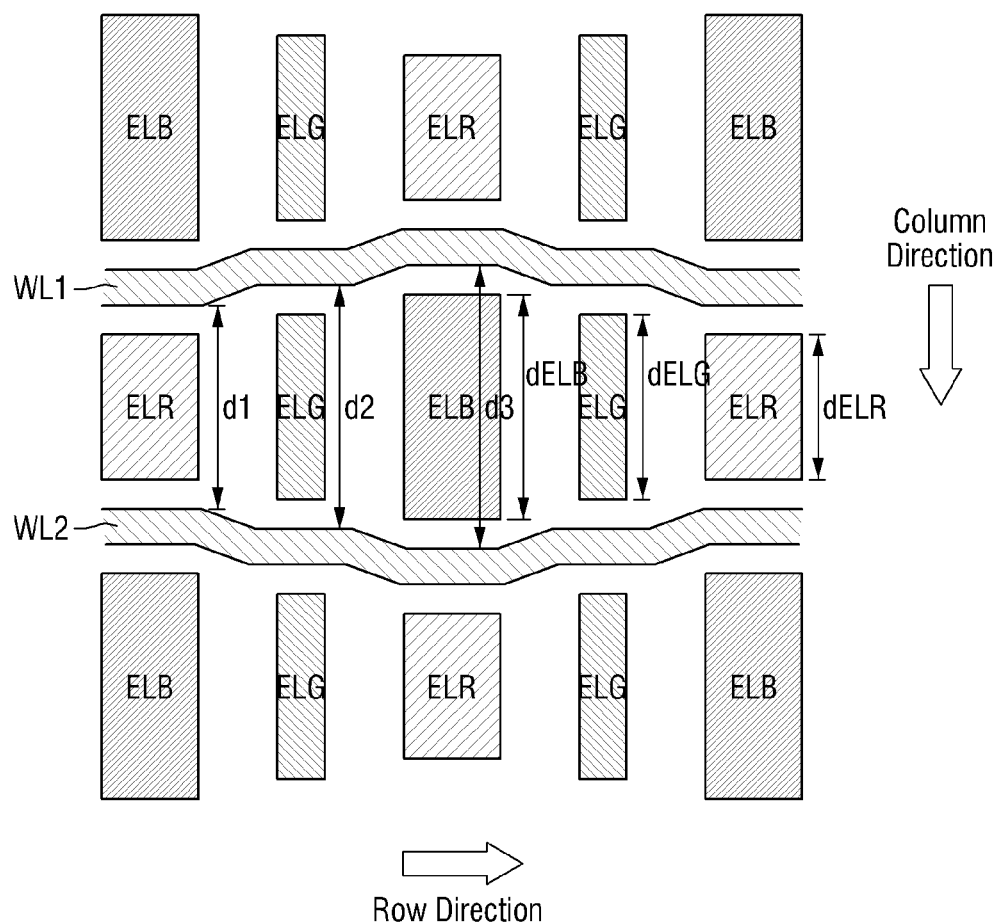
FIG. 6 is a plan view schematically illustrating the arrangement of organic layers and the wiring lines of the organic light-emitting display device shown in FIG. 1.

Referring back to FIG. 4, the organic layer EL may be disposed on the bottom electrode E1. The organic layer EL may be disposed in an aperture in which a pixel defining layer 60, which will be described later, is not formed. According to some embodiments, the organic layer EL may also be disposed on the whole surface of the organic light-emitting display device 1000. An electric current flowing through the organic layer EL may be controlled by a signal transmitted to the bottom electrode E1 and the top electrode E2. The organic layer EL may emit light at a luminance level corresponding to the electric current flowing through the organic layer EL. The organic layer EL may emit light of one of red, blue and green colors. In FIG. 4, a cross-sectional view of a first pixel PR and its surrounding area is illustrated. Therefore, the organic layer EL of FIG. 4 may emit red light. The color of light emitted from the organic layer EL is not limited to the above colors and may vary depending on embodiments. The arrangement of the organic layers EL and the wiring lines WL1 and WL2 will now be described in more detail with reference to FIG. 6. FIG. 6 is a plan view schematically illustrating the arrangement of the organic layers EL and the wiring lines WL1 and WL2 of the organic light-emitting display device 1000 shown in FIG. 1.

Referring to FIG. 6, the organic layers EL may be divided into first through third organic layers ELR, ELG and ELB. The first organic layer ELR may be placed in each of the first pixels PR, the second organic layer ELG may be placed in each of the second pixels PG, and the third organic layer ELB may be placed in each of the third pixels PB. The arrangement of the first through third organic layers ELR, ELG and ELB may be substantially identical to the arrangement of the first through third pixels PR, PG and PB in FIG. 3. A length dELR of the first organic layer ELR in the column direction may be smaller than a length dELG of the second organic layer ELG in the column direction, and the length dELG of the second organic layer ELG in the column direction may be smaller than a length dELB of the third organic layer ELB in the column direction. In FIG. 6, a case where the organic layers EL are disposed in apertures in which the pixel defining layer 60 is not formed is illustrated. However, if the organic layers EL are disposed on the whole surface of the organic light-emitting display device 1000, the arrangement of the organic layers EL may be different from that in FIG. 6.

Referring back to FIG. 4, the pixel defining layer 60 may be disposed on the planarization layer 50. The pixel defining layer 60 may define regions of the pixels PX included in the organic light-emitting display device 1000. The pixel defining layer 60 may not completely cover a top surface of the planarization layer 50. The organic light-emitting display device 1000 may include an aperture which exposes the bottom electrode E1 and in which the pixel defining layer 60 is not disposed. A region in which the aperture is located may be defined as a pixel PX.

The top electrode E2 may be disposed on the organic layer EL. The top electrode E2 may be placed over the pixels PX. The top electrode E2 may be placed on the whole surface of the organic light-emitting display device 1000. The top electrode E2 may be formed of an optically transparent or semi-transparent conductive material. For example, the top electrode E2 may be formed of, but not limited to, ITO, indium zinc oxide (IZO), a compound of magnesium (Mg) and silver (Ag), a compound of calcium (Ca) and Ag, or a compound of lithium (Li) and aluminum (Al). Light generated by the organic layer EL may be emitted to the outside of the organic light-emitting display device 1000 through the top electrode E2. To improve light transmittance of the top electrode E2, the top electrode E2 may be formed thin. For example, the top electrode E2 may be formed to a thickness of 200 Å or less.

The capping layer 70 may be disposed on the top electrode E2. The capping layer 70 may be disposed on the bottom electrode E1 or in the aperture. The capping layer 70 may also be disposed on the whole surface of the organic light-emitting display device 1000. The capping layer 70 may control optical characteristics of light emitted from the organic layer EL.

Figure 7:
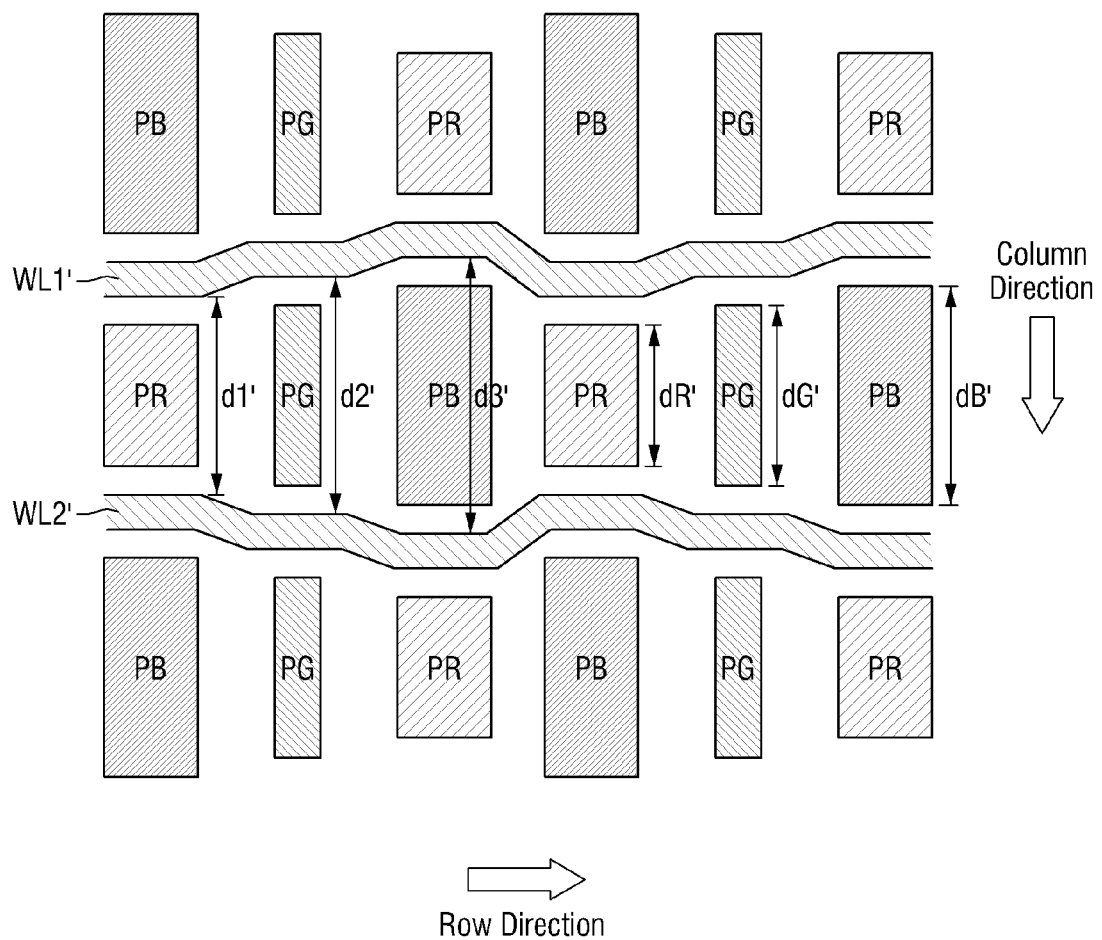
FIG. 7 is a plan view schematically illustrating the arrangement of pixels and wiring lines of an organic light-emitting display device constructed as another embodiment according to the principles of the present invention.

Another embodiment of the present invention will now be described with reference to FIGS. 7 through 9. FIG. 7 is a plan view schematically illustrating the arrangement of pixels PX and wiring lines WL1' and WL2' of an organic light-emitting display device constructed as another embodiment according to the principles of the present invention.

Referring to FIG. 7, one second pixel PG and one third pixel PB may be placed on both sides of each of first pixels PR in a row direction. The third pixels PB may be placed on both sides of each of the first pixels PR in a column direction. One first pixel PR and one third pixel PB may be placed on both sides of each of the second pixels PG in the row direction. The second pixels PG may be placed on both sides of each of the second pixels PG in the column direction. One first pixel PR and one second pixel PG may be placed on both sides of each of the third pixels PB in the row direction. The first pixels PR may be placed on both sides of each of the third pixels PB in the column direction.

The wiring lines WL1' and WL2' may be placed between rows of the pixels PR, PG and PB. The wiring lines WL1' and WL2' may be formed in a zigzag pattern. If the wiring lines WL1' and WL2' are formed in a zigzag pattern, the pixels PR, PG and PB can be formed to have different lengths in the column direction. For example, the pixels PR, PG and PB can be formed such that a length dR' of the first pixels PR in the column direction is smaller than a length dG' of the second pixels PG in the column direction and that the length dG' of the second pixels PG in the column direction is smaller than a length dB' of the third pixels PB in the column direction. Accordingly, the third pixels PB whose organic layers deteriorate relatively rapidly can easily be formed larger in area than the first and second pixels PR and PG. Generally, the luminance of light emitted from a pixel PX corresponds to an electric current flowing through an organic layer of the pixel PX. Therefore, if the third pixels PB are formed larger in area than the first and second pixels PR and PG, the density of an electric current flowing through the organic layer of each of the third pixels PB may be reduced so that the third pixels PB can emit light at the same luminance level as the first and second pixels PR and PG. An organic layer included in a pixel PX deteriorates more as the density of an electric current flowing through the organic layer increases. Therefore, a reduction in the density of the electric current flowing through the organic layer included in each of the third pixels PB may lead to an increase in the life of each of the third pixels PB. That is, if the wiring lines WL1' and WL2' are formed in a zigzag pattern, it is possible to extend the life of the third pixels PB which have a shortest life, thereby extending the life of the organic light-emitting display device. In addition, since a ratio of the area of a non-emission region other than the pixels PX to the area of the pixels PX is reduced, an aperture ratio of the organic light-emitting display device can be improved.

The wiring lines WL1' and WL2' may include a first wiring line WL1' and a second wiring line WL2'. The first wiring line WL1' and the second wiring line WL2' may be adjacent to each other. The first wring line WL1' may be placed adjacent to a side of a row of pixels PX, and the second wiring line WL2' may be placed adjacent to the other side of the row of pixels PX. If the first and second wiring lines WL1' and WL2' are formed in a zigzag pattern, a distance between the first wiring line WL1' and the second wiring line WL2' may vary according to location. For example, a distance d1' between the first wiring line WL1' and the second wiring line WL2' measured across the first pixels PR may be smaller than a distance d2' measured across the second pixels PG, and the distance d2' measured across the second pixels PG may be smaller than a distance d3' measured across the third pixels PB. In this case, since the third pixels PB can be formed wider than the first and second pixels PR and PG, the life of the third pixels PB which have a shortest life can be extended, thereby extending the life of the organic light-emitting display device 1000. In addition, the aperture ratio of the organic light-emitting display device 1000 can be improved.

Figure 8:
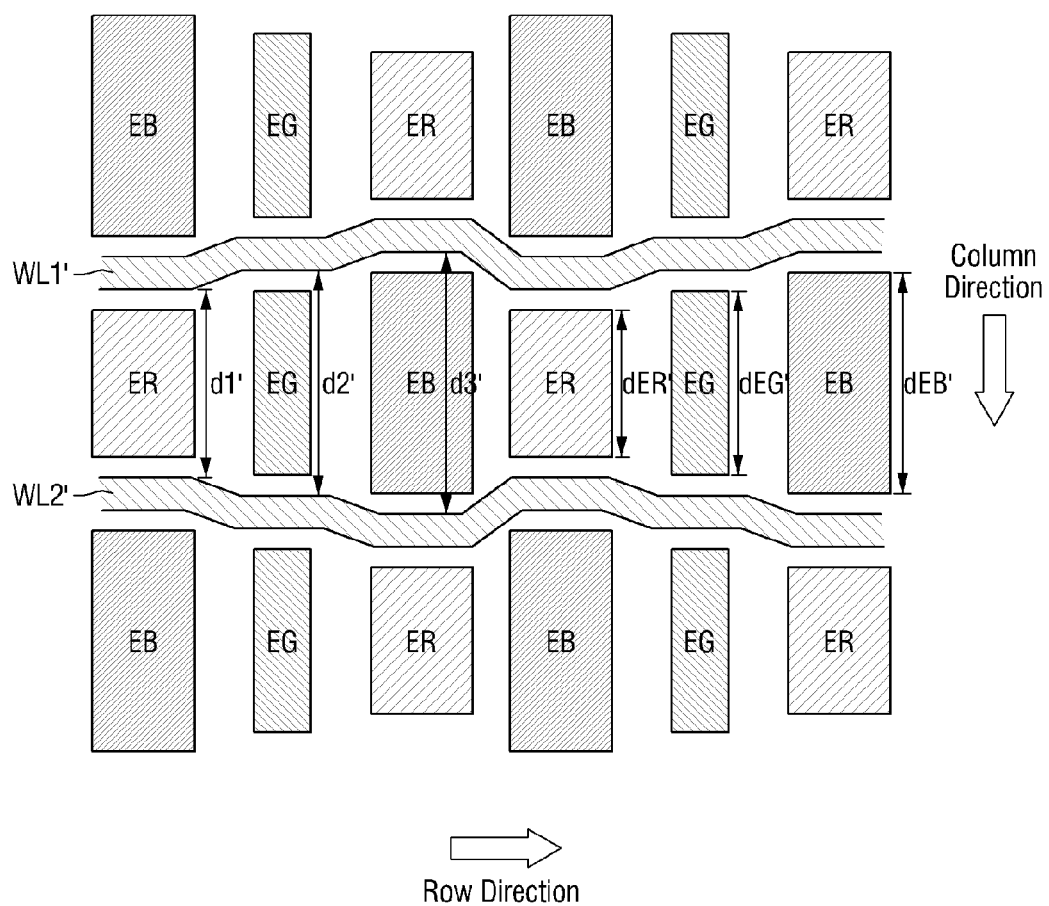
FIG. 8 is a plan view schematically illustrating the arrangement of bottom electrodes and the wiring lines of the organic light-emitting display device shown in FIG. 7.

FIG. 8 is a plan view schematically illustrating the arrangement of bottom electrodes E1 and the wiring lines WL1' and WL2' of the organic light-emitting display device shown in FIG. 7.

Referring to FIG. 8, the bottom electrodes E1 may be divided into first through third bottom electrodes ER, EG and EB. The first bottom electrode ER may be placed in each of the first pixels PR, the second bottom electrode EG may be placed in each of the second pixels PG, and the third bottom electrode EB may be placed in each of the third pixels PB. The arrangement of the first through third bottom electrodes ER, EG and EB may be substantially identical to the arrangement of the first through third pixels PR, PG and PB in FIG. 7. A length dER' of the first bottom electrode ER in the column direction may be smaller than a length dEG' of the second bottom electrode EG in the column direction, and the length dEG' of the second bottom electrode EG in the column direction may be smaller than a length dEB' of the third bottom electrode EB in the column direction. In this case, the third pixels PB may be formed longer in the column direction than the first and second pixels PR and PG. Accordingly, since the third pixels PB can easily be formed larger than the first and second pixels PR and PG, the life of the third pixels PB can be extended, thereby extending the life of the organic light-emitting display device 1000. In addition, the aperture ratio of the organic light-emitting display device 1000 can be improved.

Figure 9:
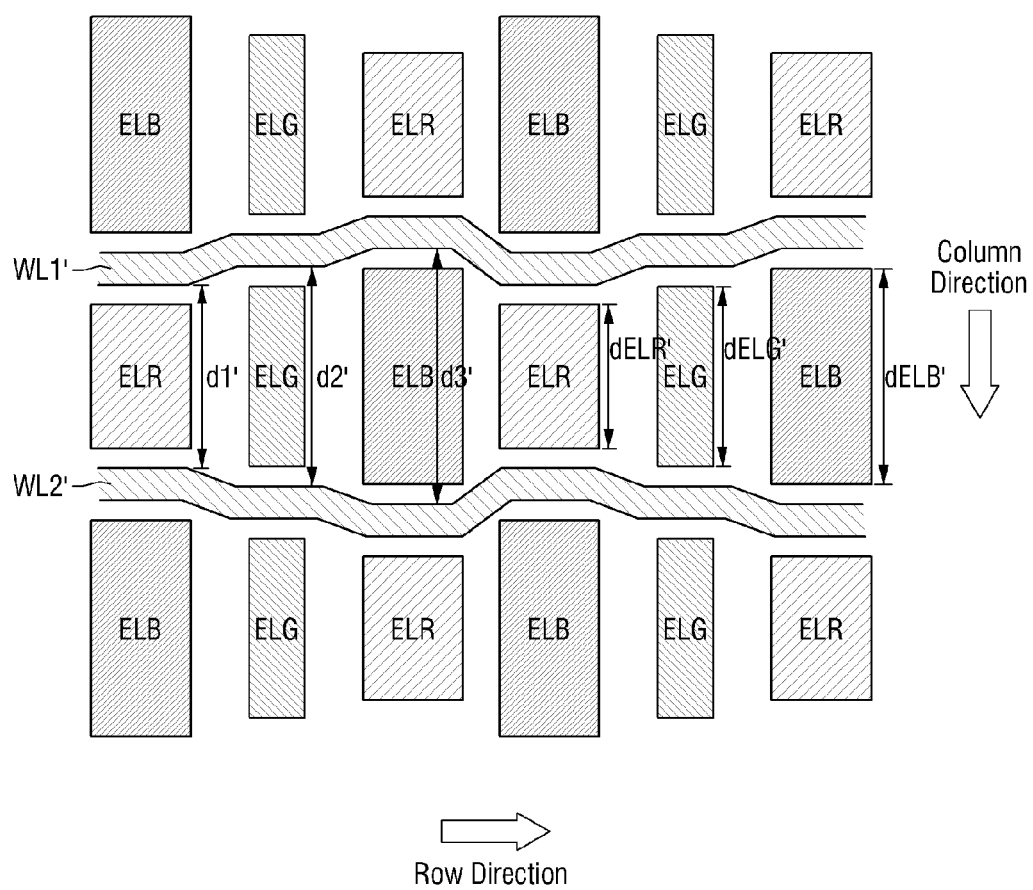
FIG. 9 is a plan view schematically illustrating the arrangement of organic layers and the wiring lines of the organic light-emitting display device shown in FIG. 7.

FIG. 9 is a plan view schematically illustrating the arrangement of organic layers EL and the wiring lines WL1' and WL2' of the organic light-emitting display device shown in FIG. 7. Referring to FIG. 9, the organic layers EL may be divided into first through third organic layers ELR, ELG and ELB. The first organic layer ELR may be placed in each of the first pixels PR, the second organic layer ELG may be placed in each of the second pixels PG, and the third organic layer ELB may be placed in each of the third pixels PB. The arrangement of the first through third organic layers ELR, ELG and ELB may be substantially identical to the arrangement of the first through third pixels PR, PG and PB in FIG. 7. A length dELR' of the first organic layer ELR in the column direction may be smaller than a length dELG' of the second organic layer ELG in the column direction, and the length dELG' of the second organic layer ELG in the column direction may be smaller than a length dELB' of the third organic layer ELB in the column direction. In FIG. 9, a case where the organic layers EL are disposed in apertures in which a pixel defining layer 60 is not formed is illustrated. However, if the organic layers EL are disposed on the whole surface of the organic light-emitting display device 1000, the arrangement of the organic layers EL may be different from that in FIG. 9.

Embodiments of the present invention provide at least one of the following advantages.

The life of an organic light-emitting display device can be extended.

In addition, the aperture ratio of the organic light-emitting display device can be improved.

However, the effects of the present invention are not restricted to the one set forth herein. The above and other effects of the present invention will become more apparent to one of daily skill in the art to which the present invention pertains by referencing the claims.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. An organic light-emitting display device, comprising:
a plurality of pixels arranged in a matrix pattern defining a plurality of intersecting rows and columns; and
a plurality of wiring lines formed in a zigzag pattern and extending in a direction of the rows between different neighboring rows of the pixels,
the plurality of pixels including a first pixel and a second pixel interposed between two of the plurality of wiring lines adjacent to each other, a shortest distance between the two wiring lines across the first pixel being smaller than a shortest distance between the two wiring lines across the second pixel.

2. The display device of claim 1, wherein an initialization signal is transmitted to the wiring lines.

3. The display device of claim 1, further comprising a plurality of data lines extending in a direction of the columns between the pixels.

4. The display device of claim 1, wherein a distance determined in the direction of the columns between the two of the plurality of wiring lines adjacent to each other varies according to color of a pixel interposed between the two wiring lines.

5. The display device of claim 4, wherein the first pixel emits red light, the second pixel emits green light, and the pixels further comprises a third pixel which emits blue light interposed between the two wiring lines,
wherein the distance between the two wiring lines across the second pixel is smaller than a distance between the two wiring lines across the third pixel.

6. The display device of claim 5, wherein the third pixel is interposed between two pixels emitting red light in the direction of the columns, the first pixel is interposed between two pixels emitting blue light in the direction of the columns, and the second pixel is interposed between two pixels emitting green light in the direction of the columns.

7. The display device of claim 6, wherein the second pixel is adjacent to both sides of the first pixel and the third pixel in the direction of the rows.

8. The display device of claim 6, wherein both sides of each of the first through third pixels in the direction of rows are not adjacent to pixels of the same type as that of the corresponding pixel.

9. The display device of claim 5, wherein a length of the first pixel in the direction of the columns is smaller than a length of the second pixel in the direction of the columns, and the length of the second pixel in the direction of the columns is smaller than a length of the third pixel in the direction of the columns.

10. An organic light-emitting display device, comprising:
a substrate;
an insulating layer disposed on the substrate;
a plurality of bottom electrodes arranged on the insulating layer in a matrix pattern defining a plurality of intersecting rows and columns;
an organic layer disposed on each of the bottom electrodes;
a top electrode disposed on the organic layer; and
a plurality of wiring lines formed on the insulating layer in a zigzag pattern and placed between the rows of the bottom electrodes,
the organic layer comprising first through third emission regions which respectively emit light of first through third colors, the bottom electrodes comprising first through third bottom electrodes respectively disposed under the first through third emission regions, and a distance between the wiring lines adjacent to the first bottom electrode which is measured across the first bottom electrode is smaller than a distance between the wiring lines adjacent to the second bottom electrode which is measured across the second bottom electrode, and the distance between the wiring lines adjacent to the second bottom electrode which is measured across the second bottom electrode is smaller than a distance between the wiring lines adjacent to the third bottom electrode which is measured across the third bottom electrode.

11. The display device of claim 10, wherein an initialization signal is transmitted to the wiring lines.

12. The display device of claim 10, wherein the wiring lines comprise:

a first wiring line placed on a side of one of the plurality of rows of the bottom electrodes; and a second wiring line placed on the other side of the row, wherein a distance between the first wiring line and the second wiring line varies according to the color of light emitted from the organic layer.

13. The display device of claim 12, wherein the organic layer emits light of any one of red, green and blue colors, wherein a length of the organic layer, which emits red light, in a direction of the columns is smaller than a length of the organic layer, which emits green light, in the direction of the columns, and the length of the organic layer, which emits the green light, in the direction of the columns is smaller than a length of the organic layer, which emits blue light, in the direction of the columns.

14. The display device of claim 10, wherein the first color is the red color, the second color is the green color, and the third color is the blue color.

15. The display device of claim 14, wherein the first bottom electrode is interposed between bottom electrodes of two pixels emitting blue color in the direction of the columns, and the third bottom electrode is interposed between bottom electrodes of two pixels emitting red color in the direction of columns.

16. The display device of claim 15, wherein the second bottom electrode is interposed between two bottom electrodes of two pixels emitting green color in the direction of columns.

17. The display device of claim 14, wherein a length of the first bottom electrode in the direction of columns is smaller than a length of the second bottom electrode in the direction of columns, and the length of the second bottom electrode in the direction of columns is smaller than a length of the third bottom electrode in the direction of columns.

18. The display device of claim 10, wherein a length of the first emission region in the direction of the columns is smaller than a length of the second emission region in the direction of columns, and the length of the second emission region in the direction of the columns is smaller than a length of the third emission region in the direction of the columns.

* * * * *